(12) United States Patent
Kim et al.

(10) Patent No.: US 7,482,625 B2
(45) Date of Patent: Jan. 27, 2009

(54) COMPOSITION FOR THERMOSETTING ORGANIC POLYMERIC GATE INSULATING LAYER AND ORGANIC THIN FILM TRANSISTOR USING THE SAME

(75) Inventors: Gi Heon Kim, Seo-gu Daejeon (KR);
Sung Min Yoon, Daejeon (KR); In Kyu You, Daejeon (KR); Seung Youl Kang, Daejeon (KR); Seong Deok Ahn, Daejeon (KR); Kyu Ha Baek, Daejeon (KR); Kyung Soo Suh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 193 days.

(21) Appl. No.: 11/204,693

(22) Filed: Aug. 16, 2005

(65) Prior Publication Data

US 2006/0097249 A1  May 11, 2006

(30) Foreign Application Priority Data

Nov. 10, 2004  (KR) .................. 10-2004-0091257

(51) Int. Cl.
*H01L 51/30* (2006.01)
*C07C 281/06* (2006.01)
*C07D 251/54* (2006.01)

(52) U.S. Cl. ................. 257/40; 257/E51.007; 544/196; 564/34

(58) Field of Classification Search .......... 257/40, 257/E51.005–E51.007; 544/7–13, 196, 200, 544/204; 438/99; 554/35–37; 564/34–35, 564/153

See application file for complete search history.

(56) References Cited

U.S. PATENT DOCUMENTS

| 6,740,900 | B2 * | 5/2004 | Hirai ......................... 257/40 |
| 7,045,814 | B2 * | 5/2006 | Bao et al. .................... 257/40 |
| 2004/0219460 | A1 * | 11/2004 | Bernds et al. ............... 430/311 |

FOREIGN PATENT DOCUMENTS

| JP | 05216232 | * | 8/1993 |
| JP | 05216232 A | * | 8/1993 |
| JP | 09003361 A | * | 1/1997 |

(Continued)

OTHER PUBLICATIONS

Halik, M., et al., "Polymer Gate Dielectrics and Conducting-Polymer Contacts for high-Performance Organic Thin-Film Transistors", Adv. Mater. 2002, 14, No. 23, Dec. 3.*

(Continued)

*Primary Examiner*—Douglas M Menz
*Assistant Examiner*—Matthew W Such
(74) *Attorney, Agent, or Firm*—Ladas & Parry LLP

(57) ABSTRACT

Provided are a composition for thermosetting organic polymeric gate insulating layer and an organic thin film transistor using the same. The composition for thermosetting organic polymeric gate insulating layer contains a thermosetting material in polyvinyl phenol as an organic polymeric gate insulating layer material, to improve a chemical resistance and an insulating property, and an organic thin film transistor includes a thermosetting organic polymeric gate insulating layer formed of the composition. The composition for thermosetting organic polymeric gate insulating layer endows an organic polymer with a thermosetting property, thereby being capable of improving the chemical resistance and the insulating property as well as of forming a layer having a device property improved.

12 Claims, 2 Drawing Sheets

FOREIGN PATENT DOCUMENTS

| | | | |
|---|---|---|---|
| JP | 2004-128469 | * | 7/2003 |
| JP | 2004 128469 | | 4/2004 |
| KR | 10 0428002 | | 3/2003 |

OTHER PUBLICATIONS

Zschieschang, U., et al., "Flexible Organic Circuits with Printed Gate Electrodes", Adv. Mater. 2003, 15, No. 14, 2007.*

CAS Database, Nov. 1984, CAS Registry No. 4261-70-5.*

Halik, et al., "Polymer Gate Dielectrics and Conducting Polymer Contacts for High-Performance Organic Thin-Film Transistors", Adv. Materi. 2002, 14, No. 23, Dec. 3.*

CAS Database, Nov. 1984, CAS Registry No. 4261-70-5.*

* cited by examiner

COMPOSITION FOR THERMOSETTING ORGANIC POLYMERIC GATE INSULATING LAYER AND ORGANIC THIN FILM TRANSISTOR USING THE SAME

CROSS-REFERENCE TO RELATED APPLICATION

This application claims priority to and the benefit of Korean Patent Application No. 2004-91257, filed Nov. 10, 2004, the disclosure of which is incorporated herein by reference in its entirety.

BACKGROUND

1. Field of the Invention

The present invention relates to a composition for thermosetting organic polymeric gate insulating layer and an organic thin film transistor using the same, and more particularly, to a composition for thermosetting organic polymeric gate insulating layer containing a thermosetting material in polyvinyl phenol as a material of organic polymeric gate insulating layer, to improve a chemical resistance and an insulating property, and an organic thin film transistor using the same.

2. Discussion of Related Art

In general, in an organic semiconductor field, after a conjugated organic polymer, such as polyacetylene, exhibiting a semiconductor property has been developed, active researches have been conducted in a wide range of functional electronic devices, optical devices etc. that serve as new electrical and electronic materials due to various advantages of the organic material which has not been obtained from an existing non-organic semiconductor material such as amorphous silicon or poly silicon, for example the diversity of synthetic methods, ease of forming into fiber or film shapes, flexibility, conductivity, and an inexpensive cost of production.

The researches on devices using these conductive polymers, particularly on an organic thin film transistor (TFT) using the organic material as an active layer have begun since 1980s. Currently, many researches are carried out all over the world.

The organic TFT is almost similar to a Si-TFT in structure, but it has a difference in that it makes use of the organic material instead of Si in a semiconductor region. The organic TFT has advantages capable of forming a thin film by means of an atmospheric pressure wet process (a printing coating process, a spin coating process, a bar coating process, or so forth) instead of a plasma enhanced chemical vapor deposition (CVD) for forming an existing Si-based thin film, and furthermore of realizing an inexpensive transistor by the aid of a roll-to-roll process using a plastic substrate.

It is currently expected that the organic TFT will be applied to a driving device of a plastic-based active organic electroluminescent display, a smart card, a plastic chip for inventory tags.

The organic TFT undergoes a performance test by means of electric charge mobility, on-off ratio, threshold voltage etc., and approaches an a—Si TFT in performance. Further, the performance of the organic TFT is influenced by a degree of crystallinity of an organic active layer, an interfacial charge characteristic between an organic insulating layer and an organic active layer, a thin film characteristic of the organic insulating layer, carrier injecting capability of interfaces between source and drain electrodes and the organic active layer, and so forth. In order to improve these characteristics, various methods have been attempted.

In particular, the use of a gate insulating layer of the organic TFT requires a material having low electrical conductivity and good breakdown field characteristic. The organic polymeric gate insulating layer that has been in use up to now includes polyimide (Korean Patent Publication No. 2003-0016981), polyvinyl alcohol (Korean Patent Publication No. 2002-0084427), poly(vinylphenol-maleimide) (Korean Patent Publication No. 2004-0028010), photoacryl, and so forth, but it has not shown enough characteristic to substitute an existing non-organic insulating layer. The non-organic insulating layer is formed at a high temperature. As such, when the non-organic insulating layer is applied to the organic TFT, it may have an influence on physical/chemical properties of an employed substrate (particularly, a plastic substrate) and another layer formed on a substrate in the previous process (hereinafter, referred to as a "prior process layer"), thus influencing the characteristics of the transistor.

Therefore, in order to realize the high-performance organic TFT, there is an acute need for development of the organic active layer material as well as the organic gate insulating layer that can be formed by a simplified process without having an influence on the substrate and the prior process layer (another layer formed on the substrate) and which is excellent in device property.

In this regard, the present inventors have found that, while they continue the research on the organic polymeric gate insulating layer for realizing the organic TFT at a high efficiency, a layer capable of improving a chemical resistance and an insulating property can be formed when a thermosetting material is included in the gate insulating layer material such as polyvinyl phenol and the device property can be improved when such a layer is employed to the organic TFT, and they completed the present invention.

SUMMARY OF THE INVENTION

The present invention is directed to a composition for thermosetting an organic polymeric gate insulating layer capable of improving a chemical resistance and an insulating property.

The present invention is also directed to an organic thin film transistor (TFT) having a device property improved by including a thermosetting organic polymeric gate insulating layer formed of the composition comprising the gate insulating layer material and the thermosetting material.

One aspect of the present invention is to provide a composition for thermosetting organic polymeric gate insulating layer comprising polyvinyl phenol of the following Formula I and a thermosetting material of 0.1% or more based on weight of polyvinyl phenol:

[Formula I]

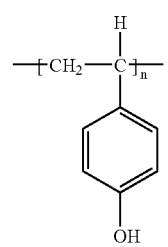

wherein n is 10 or more.

In the composition for thermosetting organic polymeric gate insulating layer according to the present invention, the thermosetting material may be preferably selected from materials having a structure of the following Formula IIA or Formula IIB:

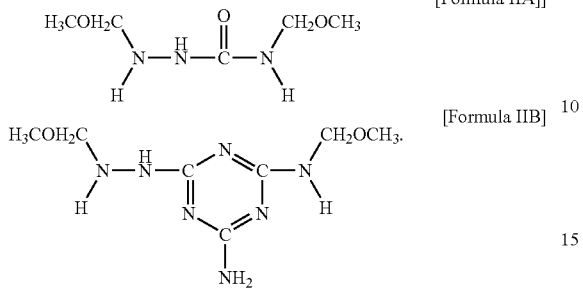

Another aspect of the present invention is to provide an organic thin film transistor (TFT) comprising a substrate, a gate electrode, a thermosetting organic polymeric gate insulating layer formed of the composition comprising polyvinyl phenol and a thermosetting material, an organic active layer and source and drain electrodes.

Further, the organic polymeric gate insulating layer in the organic TFT according to the present invention may be preferably formed by a spin coating method, a dipping method or a printing method.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIG. 2 is a graph showing a leakage current density-voltage change of polyvinyl phenol based on addition of a thermosetting material according to the present invention; and.

DETAILED DESCRIPTION OF PREFERRED EMBODIMENTS

Figure 1:
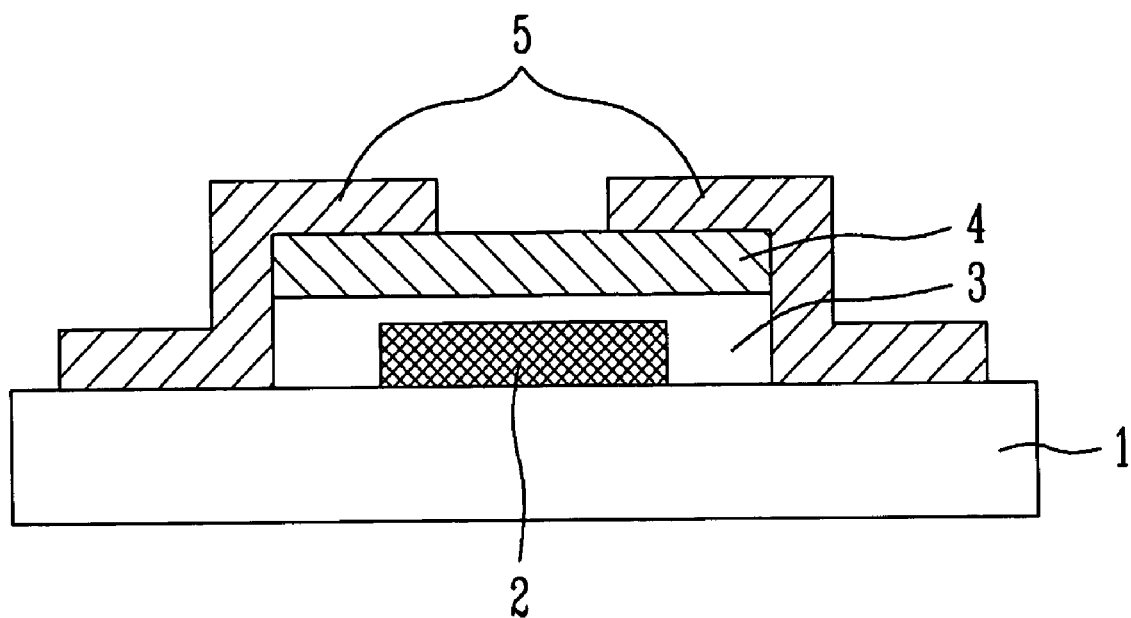
FIG. 1 is a cross-sectional view showing a structure of an organic TFT according to one embodiment of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure is thorough and complete and fully conveys the scope of the invention to those skilled in the art.

According to one aspect of the present invention, the present invention is directed to a composition for thermosetting organic polymeric gate insulating layer that contains a thermosetting material in polyvinyl phenol as a polymeric material of a gate insulating layer.

The organic polymeric gate insulating layer material, polyvinyl phenol, has a structure of the following Formula I.

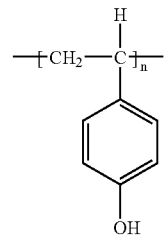

wherein, n is 10 or more.

A degree of polymerization n of polyvinyl phenol may be determined according to how it is used or applied, and is preferably at least 10.

For the use of polyvinyl phenol, polyvinyl phenol is dissolved in a solvent at a concentration of 0.1 wt % or more. The solvent may make use of one that is generally used in this field, preferably dimethylformamide. The concentration of polyvinyl phenol in solvent should be 0.1 wt % or more, so that coating characteristics and a thickness of a layer can be secured.

When used for a gate insulating layer, polyvinyl phenol may be used by physically blending with another polymer in consideration of physical, chemical and electrical characteristics. Thus, upon blending, a content of polyvinyl phenol is preferably between 1 and 99 wt % of a total weight of a composition in consideration of a change in characteristic of polyvinyl phenol.

The polymers that can be blended may include polyacrylate, polyvinyl alcohol, polyepoxy, polystyrene, polyvinyl pyrrolidone, etc.

Using the thermosetting material in the composition for thermosetting organic polymeric gate insulating layer according to the present invention can improve a chemical resistance as well as an insulating property through a crosslinking reaction of the polymer.

The thermosetting material having these characteristics has a slight difference according to its kind, but it is preferably used in 0.1 wt % or more based on weight of polyvinyl phenol. The thermosetting material can be endowed with a thermosetting property only when being added in an amount of 0.1 wt % or more based on weight of polyvinyl phenol, and may be used up to a range where a characteristic of the gate insulating layer is not damaged. Further, a proper amount of the thermosetting material may be appropriately determined according to a use purpose, application, type and amount of components, and so forth.

Preferably, the thermosetting material may be a material having a structure of the following Formula IIA or Formula IIB.

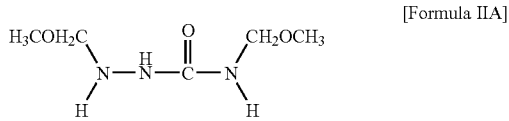

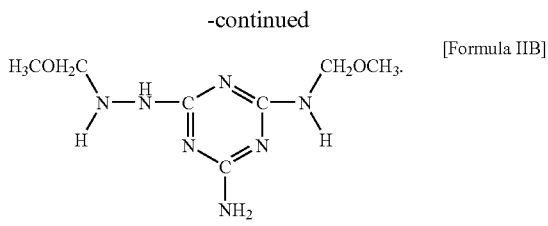
[Formula IIB]

The thermosetting organic polymeric gate insulating layer formed of the composition for thermosetting organic polymeric gate insulating layer comprising polyvinyl phenol and the thermosetting material may be used in an organic thin film transistor (TFT).

The organic TFT, as shown in FIG. 1, has, but not limited to, a structure where a substrate 1, a gate electrode 2, a gate insulating layer 3, an organic active layer 4 and source and drain electrodes 5 are stacked in turn or where a substrate 1, a gate electrode 2, a gate insulating layer 3, source and drain electrodes 5 and an organic active layer 4 are stacked in turn.

In the drawing, each part or layer has been sketched so that it will be easy to be recognized, and the thickness of each layer in the drawing is different from the real-scale thickness.

The substrate 1 may employ one used generally in this field, for example, glass, silicon wafer, plastic and so on, but not limited thereto.

Further, the gate electrode 2 may be formed on the substrate 1 by using typical methods in this field such as an E-beam method via a shadow mask. The gate electrode 2 may employ a metal used typically in this field, particularly gold (Au), silver (Ag), nickel (Ni), indium tin oxide (ITO), aluminum (Al), titanium (Ti), titanium nitride (TiN), chromium (Cr) and so forth, but not limited thereto.

For the gate insulating layer 3 which is formed on the gate electrode 2, the thermosetting organic polymeric gate insulating layer formed of a composition comprising polyvinyl phenol of the following Formula I and the thermosetting material of the following Formula IIA or Formula IIB below is used.

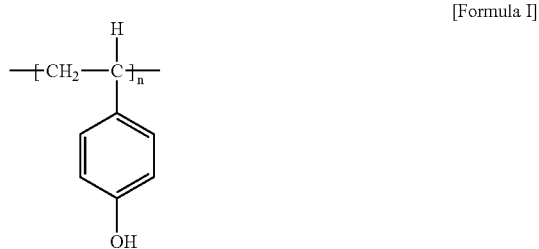
[Formula I]

where n is 10 or more.

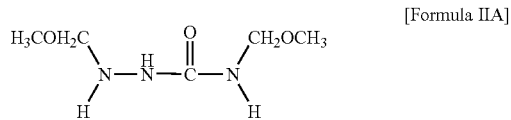
[Formula IIA]

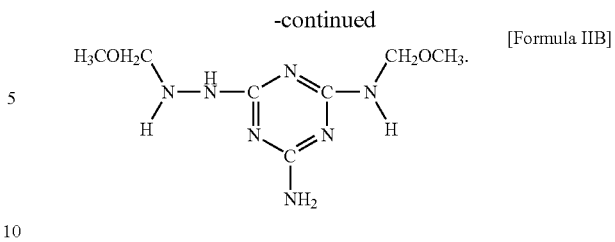
[Formula IIB]

Here, the thermosetting material is used in at least 0.1 wt % by weight of polyvinyl phenol. As the thermosetting compound is added, the polymeric gate insulating layer having a chemical resistance and an insulating property improved may be formed.

The thermosetting organic polymeric gate insulating layer is formed on the gate electrode through a wet process, particularly by applying a composition for the gate insulating layer through a spin coating method, a dipping method or a printing method, and then baking.

The organic active layer 4 is formed on the gate insulating layer 3. A material constituting the organic active layer 4 may make use of, but not limited to, pentacene, DH6T (dihexylsexithiophene), P3HT (poly(3-hexylthiophene) regioregular), F8T2 (poly-9,9-dioctylfluorene-co-bithiophene), DHADT (dihexylanthra-dithiophene) or their derivatives.

The organic active layer 4 may be formed through such a method as depositing the material under the conditions known generally in this field.

Further, the source and drain electrodes 5 may make use of, but not limited to, a typical metal such as gold (Au), indium tin oxide (ITO), aluminum (Al), chromium (Cr) and so forth.

The source and drain electrodes 5 may be formed through a method known generally in this field, preferably through an E-beam method using a shadow mask.

The substrate 1, the gate electrode 2, the gate insulating layer 3, the organic active layer 4 and the source and drain electrodes 5 may each be formed having a general thickness used in this field.

Hereinafter, the present invention will be described in more detail based on, but not limited to, Examples.

EXAMPLE 1

Preparation of a Composition for Thermosetting Organic Polymeric Gate Insulating Layer Polyvinyl phenol was dissolved in dimethylformamide at concentration of 16 wt %. Then, in order to endow a thermosetting property, methylated melamine formaldehyde was added in an amount of 10 wt % based on weight of polyvinyl phenol. Thus, the composition for thermosetting organic polymeric gate insulating layer was prepared.

Fabrication of an Organic TFT

First, a gate electrode of Ti(50 Å)/Au(500 Å) was formed on a plastic substrate (poly(ether sulfone)) through an E-beam method by using a shadow mask.

Subsequently, the prepared composition for thermosetting organic polymeric gate insulating layer was coated on the gate electrode at a thickness of 3640 Å by spin coating of 2500 rpm, and then baked at 150° C. for 15 minutes.

Next, pentacene was deposited at a thickness of 1000 Å on condition of a low degree of vacuum of less than $1.0 \times 10^{-6}$ torr, a temperature of the substrate of 70° C. and a rate of deposition of 1 Å/sec to thus form a pentacene active layer. Source and drain electrodes were formed of gold (Au) on the pentacene active layer at a thickness of 800 Å through the E-beam method by using the shadow mask, wherein the source and drain electrodes had a channel width of 2 mm and a channel length of 100 μm.

EXAMPLES 2 TO 4

These Examples were equal to Example 1, except that methylated melamine-formaldehyde as a thermosetting agent were used in amounts of 15, 20 and 30 wt %, respectively, and that the composition for thermosetting organic polymeric gate insulating layer were coated on the gate electrodes at thicknesses of 3800, 3880 and 3060 Å respectively.

EXPERIMENTAL EXAMPLE

Measurement of a Leakage Current Density Property

A leakage current density (J-V) was measured in order to estimate electrical properties of the gate insulating layers that were prepared with the compositions adding different contents of thermosetting materials to polyvinyl phenol, respectively.

Samples to be measured made use of thin films formed from the composition for the gate insulating layer prepared in Examples 1 to 4. The results were shown in FIG. 2.

Figure 2:
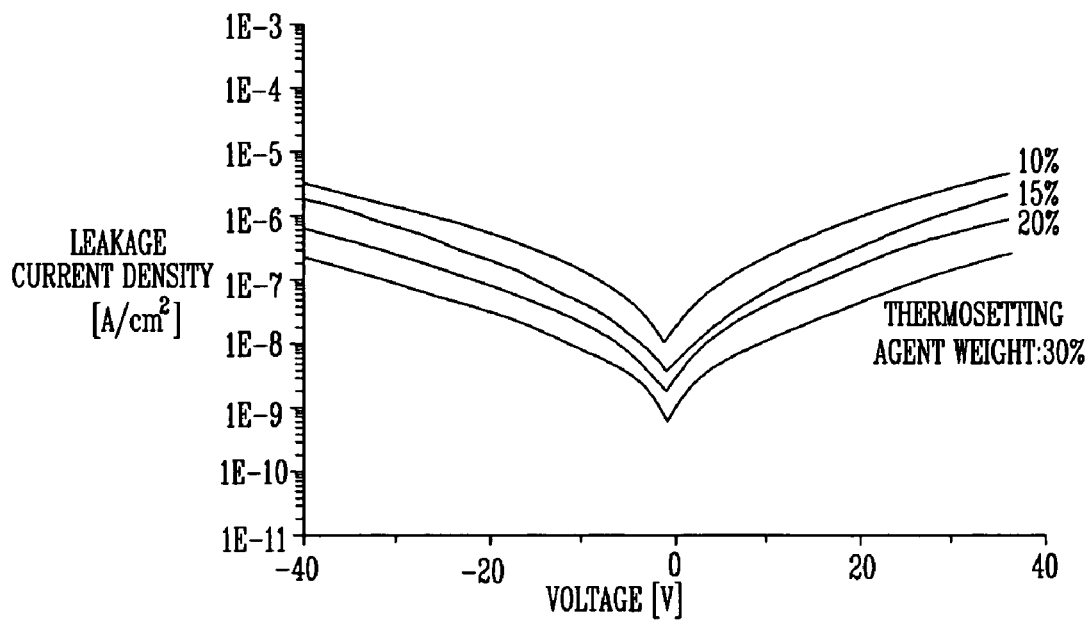

As can be seen in FIG. 2, comparison of the thermosetting polyvinyl phenol thin films adding different contents of thermosetting materials shows that, as the addition amount of the thermosetting material was increased, the leakage current density was improved.

Estimation of a Dielectric Property

As a second estimation for examining dielectric properties of the gate insulating layers of Examples 1 to 4, a capacitance-frequency (C-F) curve was examined. On the basis of results obtained at this time, values of permittivity and dielectric loss calculated by the following Equations are given in Table 1.

$$C(\text{capacitance}) = \epsilon_r \epsilon_0 d/A \quad \text{[Equation I]}$$

Where d is the thickness, A is the area, and $\epsilon_0$ is the air or vacuum dielectric constant.

$$\epsilon_r(\text{permittivity}) = Cd/\epsilon_0 A \quad \text{[Equation II]}$$

TABLE 1

| | Increment of thermosetting agent (based on weight of polyvinyl phenol) | Thickness (Å) | Permittivity (@ 1 MHz) | Dielectric loss (@ 1 MHz) |
|---|---|---|---|---|
| Polyvinyl phenol | 10% | 3640 | 5.23 | 0.07 |
| | 15% | 3800 | 5.00 | 0.06 |
| | 20% | 3880 | 4.38 | 0.06 |
| | 30% | 3060 | 2.76 | 0.04 |

It can be seen from Table 1 that the permittivity and the dielectric loss are decreased little by little in proportion to addition of the thermosetting agent. This can be explained through a change in polarization caused by a difference of a thermal behavior of a polar group (a pyrrolidone group). The dielectric behavior of the polymer is determined by the thermal behavior of the polar group and uneven distribution of electric charges. Therefore, although the same polar groups are present in a crosslinked polymer or a non-crosslinked polymer, the groups show a difference according to a degree of rigidity of surrounding chains. For this reason, as a crosslinking rate becomes higher, the permittivity of polyvinyl phenol becomes lower.

Further, in this case, no change is observed depending on whether the thermosetting material is added or not, for example, the capacitance based on a magnitude of a sweep voltage is greatly changed, or a hysteresis curve of the capacitance is changed along to a sweep direction of the voltage.

Estimation of Chemical Resistance

For the purpose of estimating a chemical resistance, the composition for thermosetting organic polymeric gate insulating layer prepared in Example 3 was coated on a glass substrate at a thickness of 3000 Å by spin coating of 2500 rpm, and then baked at 150° C. for 15 minutes. Thus, a thin film was fabricated. Subsequently, this film was impregnated into each of acetone and isopropyl alcohol that were organic solvents for 10 minutes, and dried. Then, physical/chemical damages of the film were checked by eye.

As a result, no crack was generated on a surface of the film. Further, when the film was impregnated into the organic solvent, no sign that any reaction was generated could be observed.

Measurement of a Current Transfer Characteristic

Figure 3:
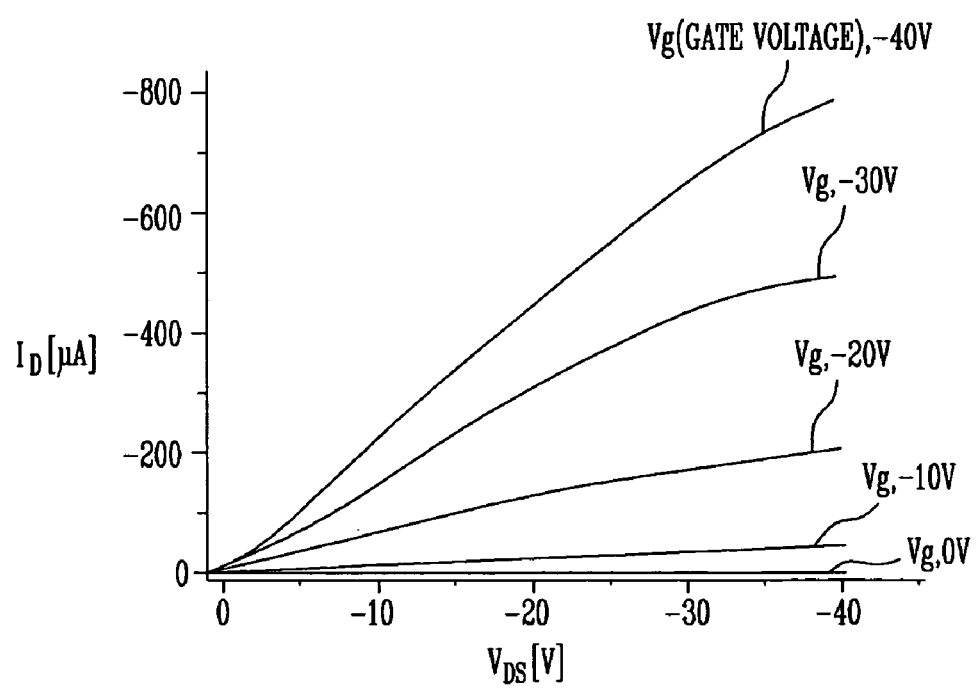
FIG. 3 is a graph showing a current transfer characteristic curve measured by using an organic TFT according to Example 1 of the present invention.

A current transfer curve of the organic TFT fabricated in Example 1 was measured by a semiconductor parameter analyzer 4145 available from HP, and shown in FIG. 3.

With the thermosetting organic polymeric gate insulating layer composition and the organic TFT using the same according to the present invention, the following effects can be obtained.

First, the thermosetting organic polymeric gate insulating layer according to the present invention improves a chemical resistance and an insulating property by means of adding the thermosetting material.

Second, the thermosetting organic polymeric gate insulating layer according to the present invention can be formed at a low temperature, thus minimizing influence on the prior process layer (i.e. layer formed in the previous process)

Third, the organic TFT using the same according to the present invention can enhance selectivity of the prior process layer by employing the thermosetting organic polymeric gate insulating layer composition, thus being capable of diversifying its structure.

Fourth, the thermosetting organic polymeric gate insulating layer according to the present invention is formed by the wet process, thus being capable of fabricating the organic TFT on a large-area substrate.

Although exemplary embodiments of the present invention have been described with reference to the attached drawings, the present invention is not limited to these embodiments, and it should be appreciated to those skilled in the art that a variety of modifications and changes can be made without departing from the spirit and scope of the present invention.

What is claimed is:

1. An organic thin film transistor comprising:
   a substrate;
   a gate electrode;
   a thermosetting organic polymeric gate insulating layer comprising polyvinyl phenol represented by the following Formula I and a thermosetting material of 0.1 wt % or more based on weight of polyvinyl phenol:

[Formula I]

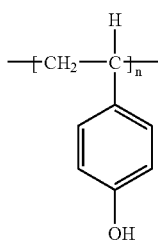

where n is 10 or more
wherein the thermosetting material having the following structure:

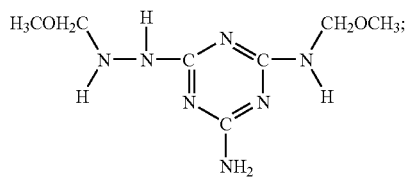

an organic active layer; and
source and drain electrodes.

2. The organic thin film transistor according to claim 1, wherein the organic polymeric gate insulating layer is formed by any one selected from the group consisting of a spin coating method, a dipping method and a printing method.

3. The organic thin film transistor of claim 1 wherein the thermosetting organic polymeric gate insulating layer further comprises another polymer blended with the polyvinyl phenol wherein the another polymer is selected from the group consisting of polyacrylate, polyvinyl alcohol, polyepoxy, polystyrene, and polyvinyl pyrrolidone.

4. The organic thin film transistor of claim 1 wherein the gate electrode is selected from the group consisting of gold, silver, nickel, indium tin oxide, aluminum and chromium.

5. The organic thin film transistor of claim 1 wherein the source and drain electrodes are selected from the group consisting of gold, aluminum, chromium, and indium tin oxide.

6. The organic thin film transistor of claim 1 wherein the organic active layer is selected from the group consisting of pentacene, dihexyl-sexithiophene (DH6T), poly(3-hexylthiophene)regioregular (P3HT), poly-9,9-dioctylfluorene-co-bithiophene (F8T2) and dihexylanthra-dithiophene (DHADT).

7. An organic thin film transistor comprising:
a substrate;
a gate electrode;
a thermosetting organic polymeric gate insulating layer comprising polyvinyl phenol represented by the following Formula I and a thermosetting material of 0.1 wt % or more based on weight of polyvinyl phenol:

[Formula I]

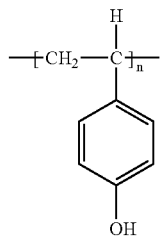

where n is 10 or more
wherein the thermosetting material having the following structure:

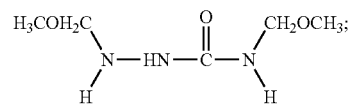

an organic active layer; and
source and drain electrodes.

8. The organic thin film transistor according to claim 7, wherein the organic polymeric gate insulating layer is formed by any one selected from the group consisting of a spin coating method, a dipping method and a printing method.

9. The organic thin film transistor of claim 7 wherein the thermosetting organic polymeric gate insulating layer further comprises another polymer blended with the polyvinyl phenol wherein the another polymer is selected from the group consisting of polyacrylate, polyvinyl alcohol, polyepoxy, polystyrene, and polyvinyl pyrrolidone.

10. The organic thin film transistor of claim 7 wherein the gate electrode is selected from the group consisting of gold, silver, nickel, indium tin oxide, aluminum, titanium, titanium nitride and chromium.

11. The organic thin film transistor of claim 7 wherein the source and drain electrodes are selected from the group consisting of gold, aluminum, chromium, and indium tin oxide.

12. The organic thin film transistor of claim 7 wherein the organic active layer is selected from the group consisting of pentacene, dihexyl-sexithiophene (DH6T), poly(3-hexylthiophene) regioregular (P3HT), poly-9,9-dioctylfluorene-co-bithiophene (F8T2) and dihexylanthra-dithiophene (DHADT).

* * * * *